(12) United States Patent
Russo et al.

(10) Patent No.: US 10,770,576 B2
(45) Date of Patent: Sep. 8, 2020

(54) POWER MOSFET DEVICE AND MANUFACTURING PROCESS THEREOF

(71) Applicant: STMICROELECTRONICS S.R.L., Agrate Brianza (IT)

(72) Inventors: Fabio Russo, Tremestieri Etneo (IT); Cristiano Gianluca Stella, San Gregorio di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 33 days.

(21) Appl. No.: 16/154,411

(22) Filed: Oct. 8, 2018

(65) Prior Publication Data

US 2019/0109225 A1 Apr. 11, 2019

(30) Foreign Application Priority Data

Oct. 10, 2017 (IT) .................. 102017000113926

(51) Int. Cl.
*H01L 29/78* (2006.01)
*H01L 29/10* (2006.01)
(Continued)

(52) U.S. Cl.
CPC .... *H01L 29/7802* (2013.01); *H01L 23/49562* (2013.01); *H01L 23/49575* (2013.01); *H01L 23/5384* (2013.01); *H01L 24/06* (2013.01); *H01L 24/09* (2013.01); *H01L 24/49* (2013.01); *H01L 29/086* (2013.01); *H01L 29/1095* (2013.01); *H01L 29/42372* (2013.01);
(Continued)

(58) Field of Classification Search
CPC .......... H01L 29/7802; H01L 23/49562; H01L 23/49575; H01L 23/5384; H01L 24/06; H01L 24/09; H01L 24/49; H01L 29/086; H01L 29/1095; H01L 29/42372; H01L 29/66712; H01L 23/481; H01L 23/485; H01L 24/05; H01L 24/48; H01L 29/4238; H01L 2224/02372; H01L 2224/04034; H01L 2224/04042; H01L 2224/40245; H01L 2224/48247; H01L 2924/00014
See application file for complete search history.

(56) References Cited

U.S. PATENT DOCUMENTS 6,228,719 B1 5/2001 Frisina et al.
6,300,171 B1 10/2001 Frisina
(Continued)

*Primary Examiner* — Fernando L Toledo
*Assistant Examiner* — Neil R Prasad
(74) *Attorney, Agent, or Firm* — Seed Intellectual Property Law Group LLP

(57) ABSTRACT

A MOSFET device is integrated in a body of semiconductor material of a first conductivity type accommodating a body region, of a second conductivity type, and a source region, of the first conductivity type. A gate region extends over the top surface of the body; a source pad extends over the first top surface and is electrically coupled to the source region, a first gate pad extends over the first main surface, alongside the source pad, and is electrically coupled to the gate region; a drain pad extends over the rear surface and is electrically coupled to the body; a second gate pad extends over the rear surface, alongside the drain pad; and a conductive via extends through the body and electrically couples the gate region to the second gate pad.

18 Claims, 13 Drawing Sheets

(51) Int. Cl.
*H01L 29/08* (2006.01)
*H01L 23/538* (2006.01)
*H01L 23/00* (2006.01)
*H01L 23/495* (2006.01)
*H01L 29/423* (2006.01)
*H01L 29/66* (2006.01)
*H01L 23/485* (2006.01)
*H01L 23/48* (2006.01)

(52) U.S. Cl.
CPC ...... *H01L 29/66712* (2013.01); *H01L 23/481* (2013.01); *H01L 23/485* (2013.01); *H01L 24/05* (2013.01); *H01L 24/48* (2013.01); *H01L 29/4238* (2013.01); *H01L 2224/02372* (2013.01); *H01L 2224/04034* (2013.01); *H01L 2224/04042* (2013.01); *H01L 2224/40245* (2013.01); *H01L 2224/48247* (2013.01); *H01L 2924/00014* (2013.01)

(56) References Cited

U.S. PATENT DOCUMENTS

| | | | |
|---|---|---|---|
| 6,404,010 | B2 | 6/2002 | Saggio et al. |
| 6,586,798 | B1 | 7/2003 | Frisina |
| 2006/0076660 | A1 | 4/2006 | Boschlin et al. |
| 2009/0224313 | A1 | 9/2009 | Burke |
| 2011/0266683 | A1 | 11/2011 | Feng |
| 2012/0146133 | A1 | 6/2012 | Hirler et al. |
| 2012/0264259 | A1* | 10/2012 | Hirler ............. H01L 21/823487 438/123 |
| 2012/0326207 | A1* | 12/2012 | Yoshimochi .......... H01L 29/866 257/139 |
| 2013/0181328 | A1* | 7/2013 | Cao ..................... H01L 29/0657 257/618 |
| 2014/0357048 | A1* | 12/2014 | Meiser ................ H01L 29/407 438/424 |
| 2018/0090479 | A1* | 3/2018 | Weyers ............... H01L 27/0255 |

\* cited by examiner

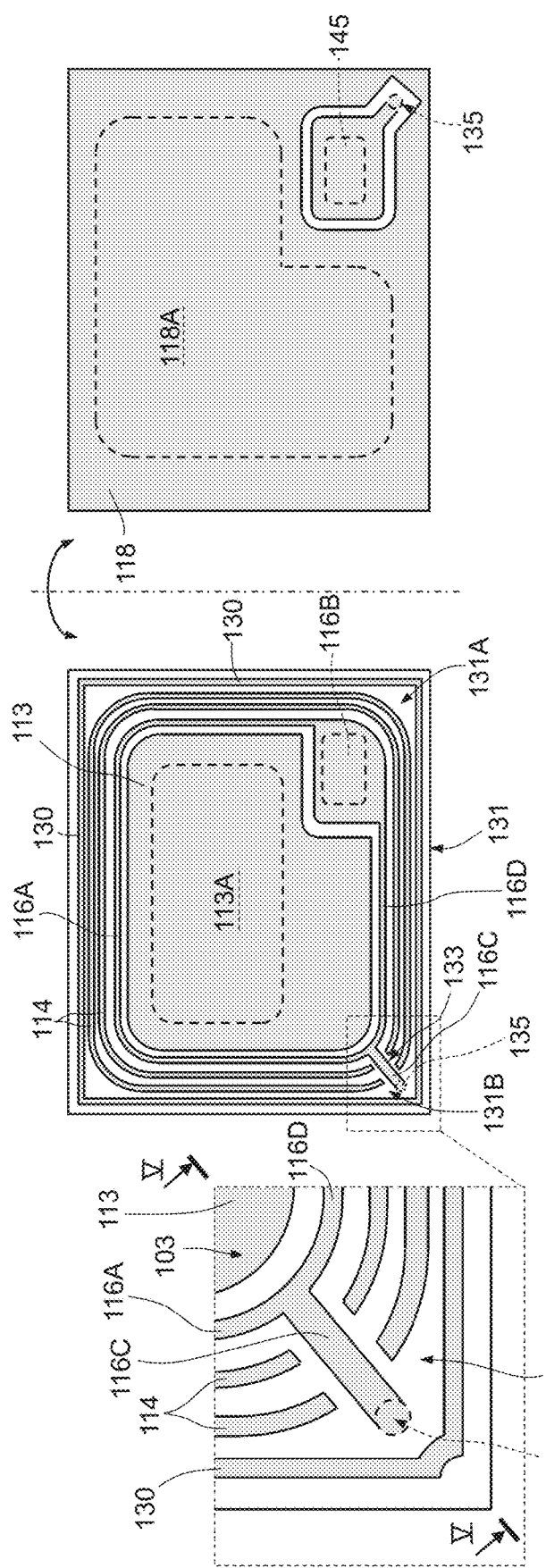
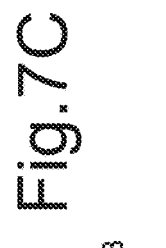
Fig. 7B
Fig. 7A
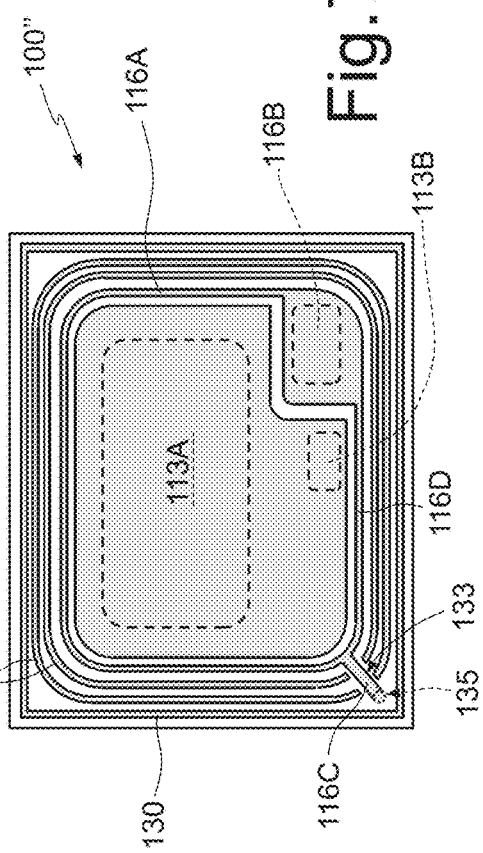
Fig. 7C

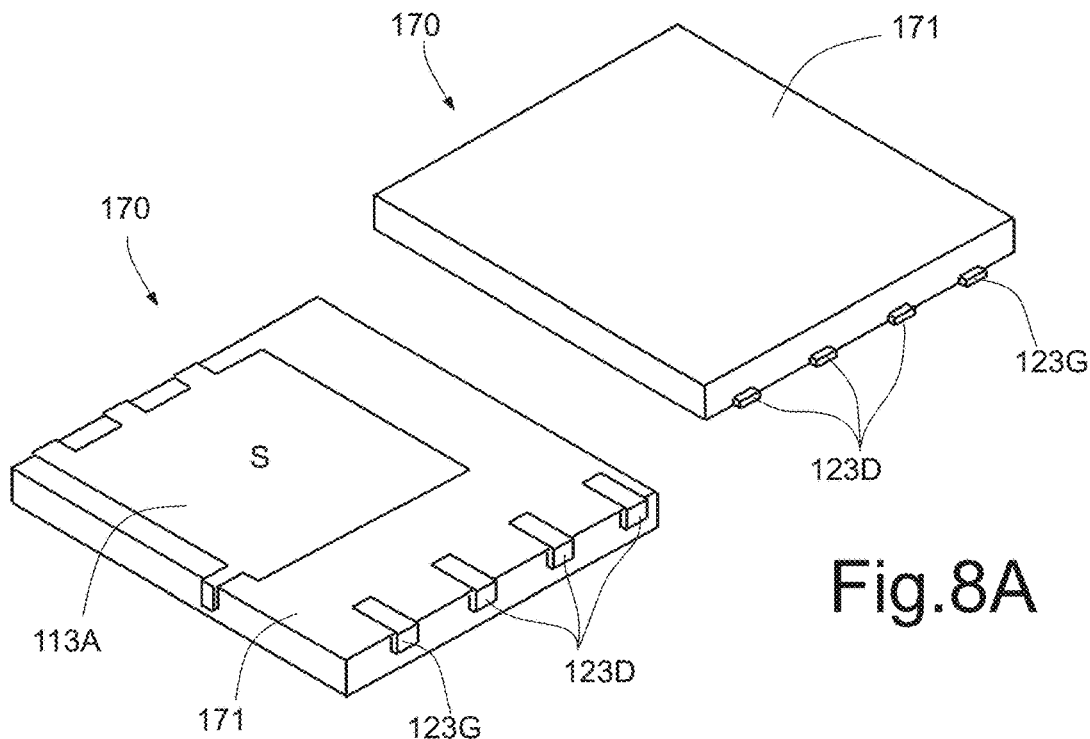
Fig.8A
Fig.8B
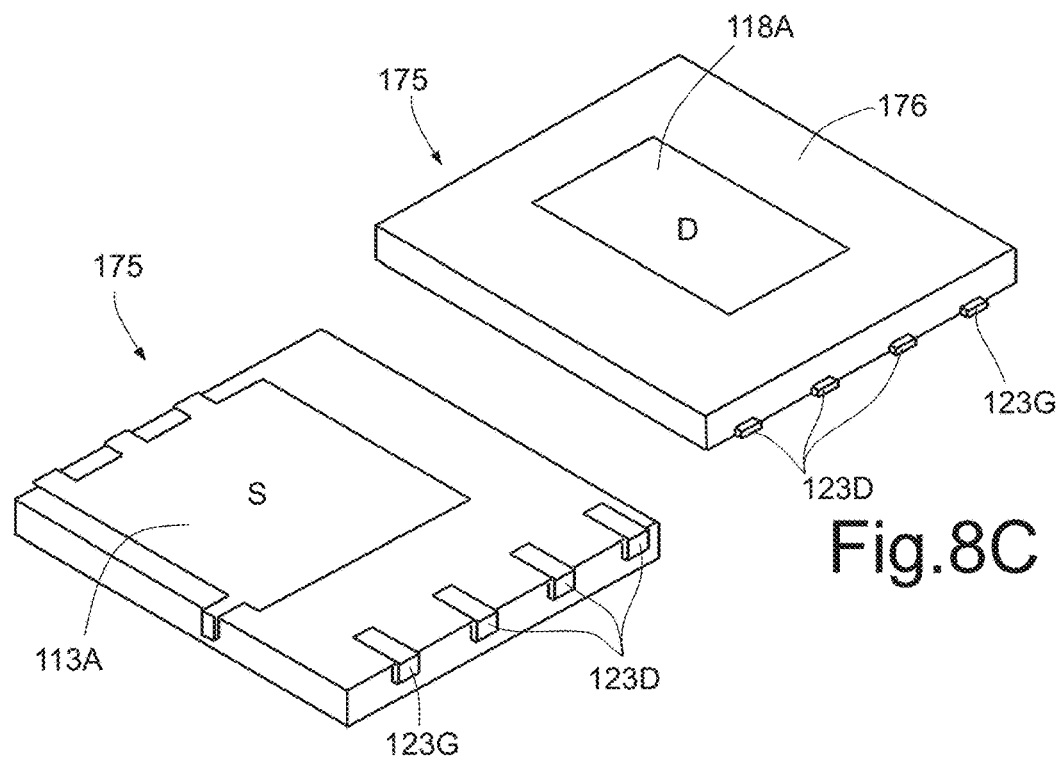
Fig.8C
Fig.8D

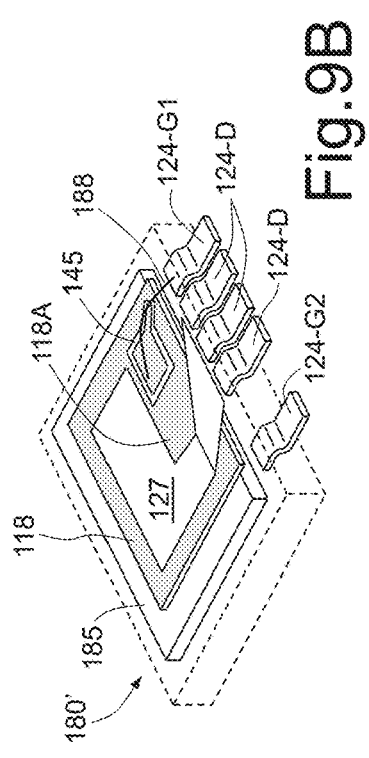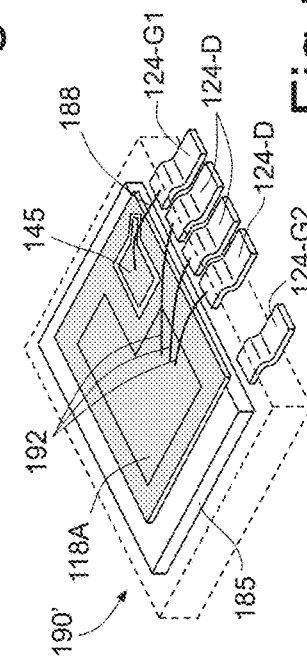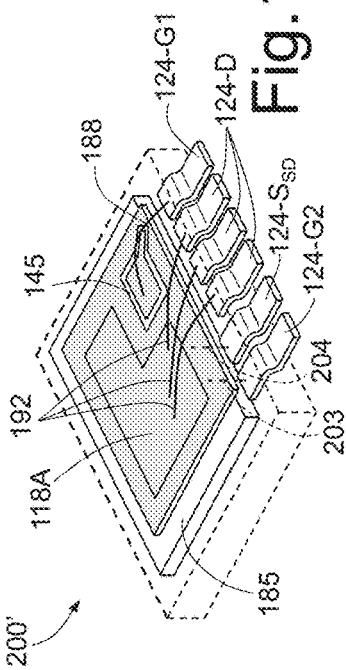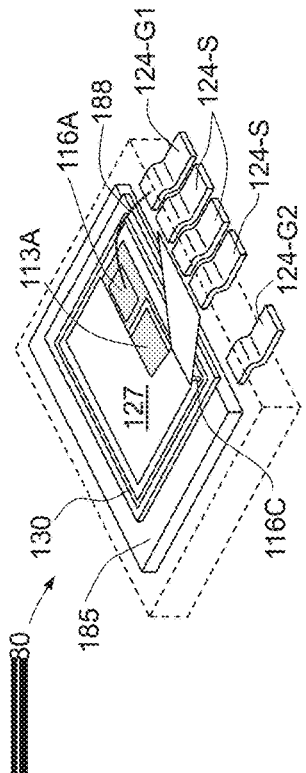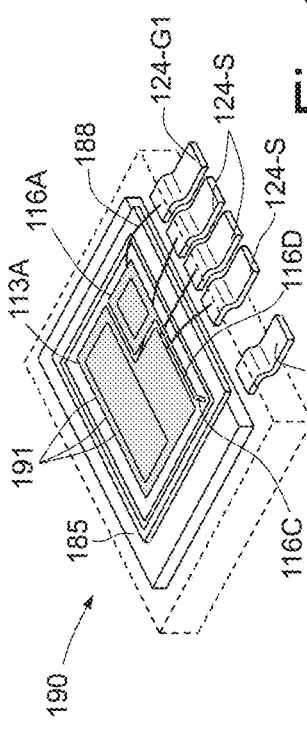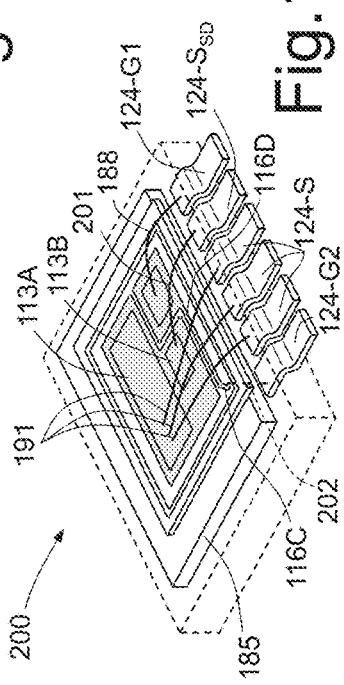

POWER MOSFET DEVICE AND MANUFACTURING PROCESS THEREOF

BACKGROUND

Technical Field

The present disclosure relates to a power MOSFET device and to the manufacturing process thereof. In particular, the following description regards a vertical-type power MOSFET device, such as for use as power converter.

Description of the Related Art

As is known, in this type of application, the power MOSFET device is biased at high voltage (even up to 600-700 V) and is passed by currents that may switch rapidly. Such devices thus generally have a drain pad on a first main surface thereof and at least two pads (namely, a source pad and a gate pad) on a second main surface, opposite to the first main surface. Such power MOSFET devices are formed in a die attached to a conductive support, called "leadframe" and has leads for external connection. Typically, one or more leads are in direct contact with one pad (typically the drain pad) and other leads are coupled to the other pads (typically, the gate and source pads) by bonding wires or clips. The die/leadframe unit is packaged in a mass of resin or other insulating material.

For a better understanding of the existing problems, reference may be made to FIGS. 1 and 2, showing the schematic structure of a power MOSFET device (here a MOSFET device of the charge-balance type, also referred to as "superjunction") and its electrical equivalent.

In detail, FIG. 1 (where the various regions are not in scale, for clarity of illustration) shows a MOSFET device 1 integrated in a die 20 comprising a body 2 of semiconductor material (typically silicon) having a top surface 2A and a rear surface 2B, and a first conductivity type, for example N. The body 2, typically formed by a substrate and by an epitaxial layer obtained by successive growths, defines an active area 3 and an edge area 4. The body 2 houses a plurality of columns 6 of a second conductivity type, here of a P type, separated by epitaxial layer areas of an N type. Body regions 7, here of a P type, extend from the top surface 2A of the body 2 up to the top end of the columns 6 in the active area 3, and house source regions 8, of an N type.

Gate regions 11 extend over the top surface 2A of the body 2, between adjacent pairs of columns 6, i.e., laterally offset with respect to the source regions 8, electrically insulated from the body and surrounded by an insulating region 12. A source metallization 13 extends over the active area 3 of the body 2, over the gate regions 11 (however, electrically insulated from the latter by the insulating regions 12), and has contact portions extending towards the top surface of the body 2, between pairs of adjacent gate regions 11, in direct electrical contact with the source regions 8. A portion of the source metallization 13 forms a source pad 13A for external electrical connection.

Electrically floating annular regions 14 extend over the edge area 4 and over one or more dielectric layers 15, and surround at the top the active area 3 and the source metallization 13. A gate metallization 16, electrically connected to the gate regions 11, also extends over the dielectric layers 15 and forms a gate pad 16A for external electrical connection. A top passivation layer 17 covers the dielectric layers 15 and the floating annular regions 14, leaving the source pad 13A and the gate pad 16A free. Further polysilicon rings (not shown) may extend within the dielectric layers 15, over the top surface 2A, underneath the floating annular regions 14, offset with respect to the latter. An equipotential annular region 30, of the same material and formed simultaneously with the floating annular regions 14, externally surrounds the latter and extends in proximity of the outer perimeter of the top surface 2A of the body 2. The equipotential annular region 30 is electrically connected to the body 2.

A drain metallization 18, forming a drain pad 18A, extends on the rear surface 2B of the body 2, in direct electrical contact with the body 2 (forming a drain region of the MOSFET device 1) and covers the entire rear surface 2B.

In practice, in the MOSFET device 1, the source pad 13A and the gate pad 16A are arranged on one side of the die 20, and the drain pad 18A is arranged on an opposite side of the die 20.

As is known, the die 20 is generally attached to a support, for example a leadframe, by bonding the drain pad 18A to a supporting portion of the leadframe, which also has a dissipating function, and connecting the source pad 13A and the gate pad 16A to respective leads via bonding wires and/or clips. The die 20 thus bonded is then coated with a packaging mass of insulating material to form a package.

Traditional packages for power devices intended for applications with switching operation generally comprise three leads (typically pins) and are arranged vertically, with the leads projecting downwards from a single smaller side of the packaging structure (of a parallelepipedal shape). Current applications increasingly employ, however, horizontal packages, for example for surface mounting. For instance, FIGS. 2A, 2B and 3A-3D show possible horizontal packages 21A, 21B, 22A, 22B; FIGS. 2A, 2B refer in particular to packages with projecting leads (pins 23) and FIGS. 3A and 3B (perspective views from above and from below, respectively), as well as FIGS. 3C and 3D (perspective views from above and from below, respectively) refer in particular to packages for surface mounting. Furthermore, FIGS. 2A, 3A, 3B show packages of a fully molded type (wherein the source pad 13A and gate pad 16A are embedded in the packaging mass and connected to respective leads 23/24-S, 24-G via bonding wires, not visible). FIGS. 2B, 3C, and 3D show packages of a dual-side-cooling (DSC) type, wherein the packaging mass exposes part of a clip 27 in direct contact with the source pad 13A and connected to the respective lead 24-S via bonding wires (not shown). For instance, in the packages 21A, 21B, 22A, 22B, three leads 23/24-S are connected to the source pad 13A, two leads 23/24-G are connected to the gate pad 16A, and a possible sixth lead 23 (FIGS. 2A, 2B) is available, for example for the reasons discussed hereinafter.

With the packages of a vertical and horizontal type described, the bonding wires that connect the source pad 13A or the clip 27 to the corresponding leads 23/24-S represent a non-negligible parasitic inductance in high-voltage/high-power devices (in particular, with high-frequency operation), as discussed hereinafter with reference to the electrical equivalent shown in FIG. 4.

In detail, FIG. 4 shows a parasitic inductance 25 in series to a source terminal S (corresponding to the source pad 13A); FIG. 4 further shows a drain terminal D (corresponding to the drain pad 18A), and a gate terminal G (corresponding to the gate pad 16A of FIG. 1).

As shown in FIG. 4, the source terminal S is normally connected to a reference potential line (ground) 26. Thus, the parasitic inductance 25 is arranged between the source terminal S and ground. The parasitic inductance 25 (of value $L_d$) is passed by the current flowing through the MOSFET device 1 and gives rise to a voltage V proportional to the value of the inductance $L_d$ and to the current variations (V=$L_d$di/dt]). Since the MOSFET devices of the considered type commonly work in a switching operating mode, which involves fast and marked current variations, the voltage V that develops on the parasitic inductance 25, called "overdrive", may considerably modify operation of the MOSFET device 1. In fact, the overdrive voltage determines a reduction of the gate-to-source voltage $V_{GS}$, modifying the on/off cycles of the MOSFET device 1 and determining efficiency losses.

Moreover, the current variations due to switching operation cause onset of a noise electromagnetic field and generation of electromagnetic interference (EMI).

To reduce the problem of the overdrive voltage, it has already been proposed to control the on and off cycles of the MOSFET 1 so that the control voltage applied to the gate terminal G is not referenced to ground. To this end, some MOSFET devices of the considered type have a further source terminal, called driver source terminal $S_D$, connected via an own bonding wire (not shown) to the source metallization 13A but not grounded, and the control voltage of the MOSFET device 1 is applied between the gate terminal G and the driver source terminal $S_D$. In this way, the gate-to-source voltage substantially corresponds to the control voltage of the MOSFET device 1 and is not modified by the presence of a possible overdrive voltage. With this solution, for example, the driver source terminal $S_D$ is connected to the outside by the further lead 23 available in the packages 21A, 21B of FIGS. 2A and 2B, referred to above, and an own bonding wire, which, not being grounded and not substantially traversed by the current of the MOSFET device 1, does not substantially modify the on/off cycle.

Notwithstanding the described solutions, however, in certain applications (such as high-frequency and high-current applications), power MOSFET devices still have efficiency losses and cause non-negligible electromagnetic interference. In addition, prior art solutions, both with vertical packaging and horizontal packaging, with the driver source terminal $S_D$ use a specific package (called "4-lead package"), which is more costly than standard packages. On the other hand, in prior art devices, it is not possible to simply flip over the die 20 due to the need of contacting the gate pad.

BRIEF SUMMARY

According to the present disclosure, a power MOSFET device and the manufacturing process thereof are provided.

In practice, the present MOSFET device envisages a gate pad on each main side of the die. In this way, the device may be mounted on the support, for example a leadframe, with the drain or the source pad indifferently, and one of the two gate metallizations is in any case accessible for wire-bonding to the respective lead. In practice, a same die of the MOSFET device may be used, oriented according to the applicative requirements. For instance, for applications where operation may involve overdrive and/or EMI problems (such as high-frequency and high-current applications) and in any case when so desired, the MOSFET device may be mounted with the source pad facing the leadframe, by contacting the drain pad and the additional gate pad on the free top side of the die; vice versa, in the absence of overdrive and/or EMI problems or for other reasons, the die may be mounted in a traditional way, with the drain pad facing the leadframe and the standard gate pad (as well as the source pad) on the free top side of the die.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 7A and 7B are a plan view from above and a plan view from below, respectively, of the die of FIG. 5 or 6;

FIG. 7C shows a top plan view of a variant of FIG. 7A;

FIGS. 8A and 8B are a perspective view from above and a perspective view from below, respectively, of a package for surface mounting used for the present power MOSFET device;

FIGS. 8C and 8D are a perspective view from above and a perspective view from below, respectively, of another package for surface mounting used for the present power MOSFET device;

FIGS. 9A and 9B show mounting of the present device on a leadframe on a first and on a second side thereof, respectively, for a package with clip;

FIGS. 10A and 10B show mounting of the present device on a leadframe on a first and on a second side thereof, respectively, for another type of package;

FIGS. 11A and 11B show mounting of the present device on a leadframe on a first and on a second side thereof, respectively, for a further type of package.

DETAILED DESCRIPTION

Figure 5:
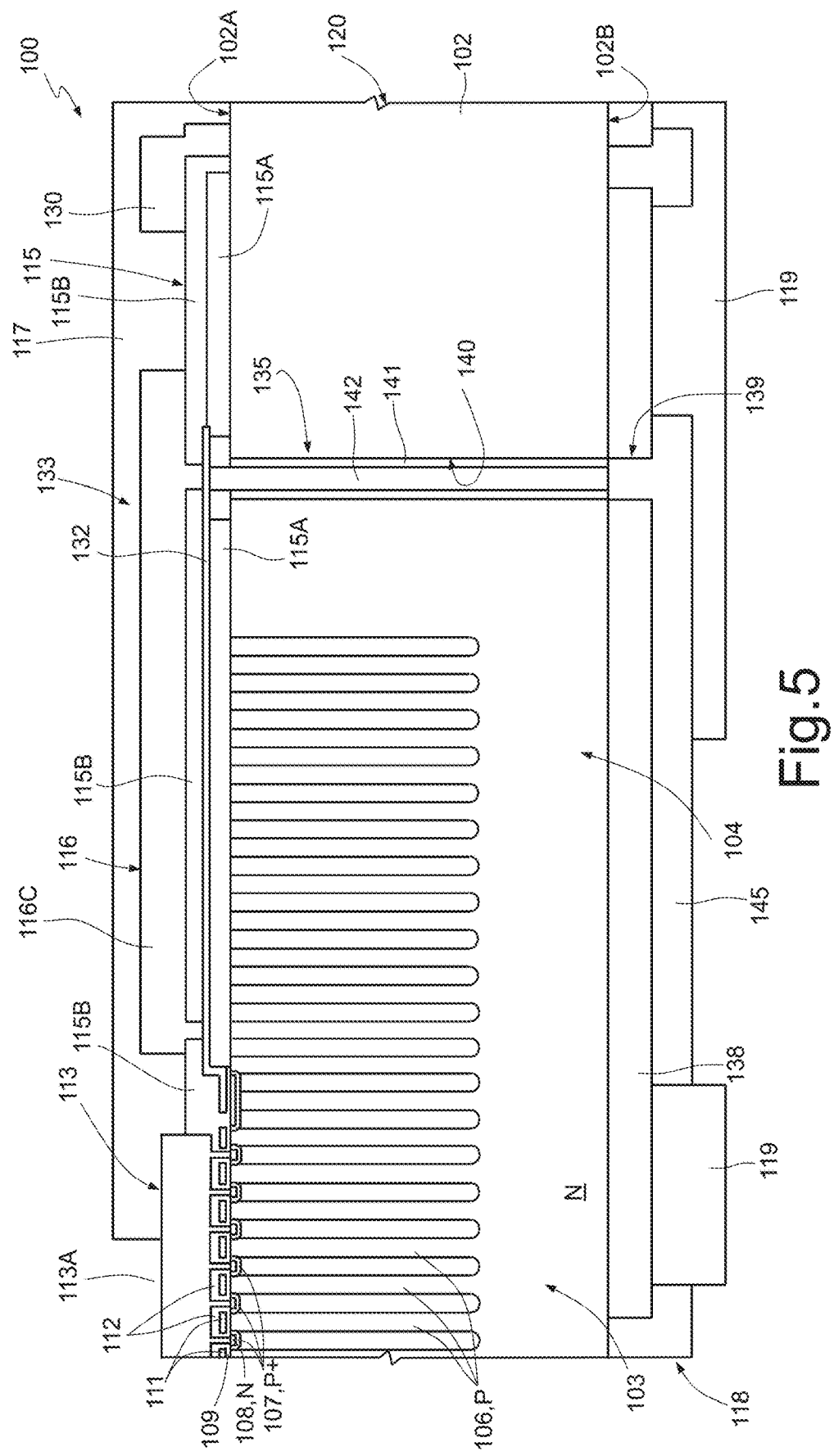
FIG. 5 is a simplified cross-section of a portion of a die integrating an embodiment of the present power MOSFET device.

FIG. 5 shows schematically a portion of a MOSFET device 100, the regions whereof are not represented in scale, for clarity of illustration. In the following description, further, indications of position, such as "vertical", "lateral", etc., refer to the conventional arrangement, shown in the figure, where the vertical direction corresponds to the thickness direction of the device and the lateral direction is a parallel direction to the main surfaces of the die.

Figure 1:
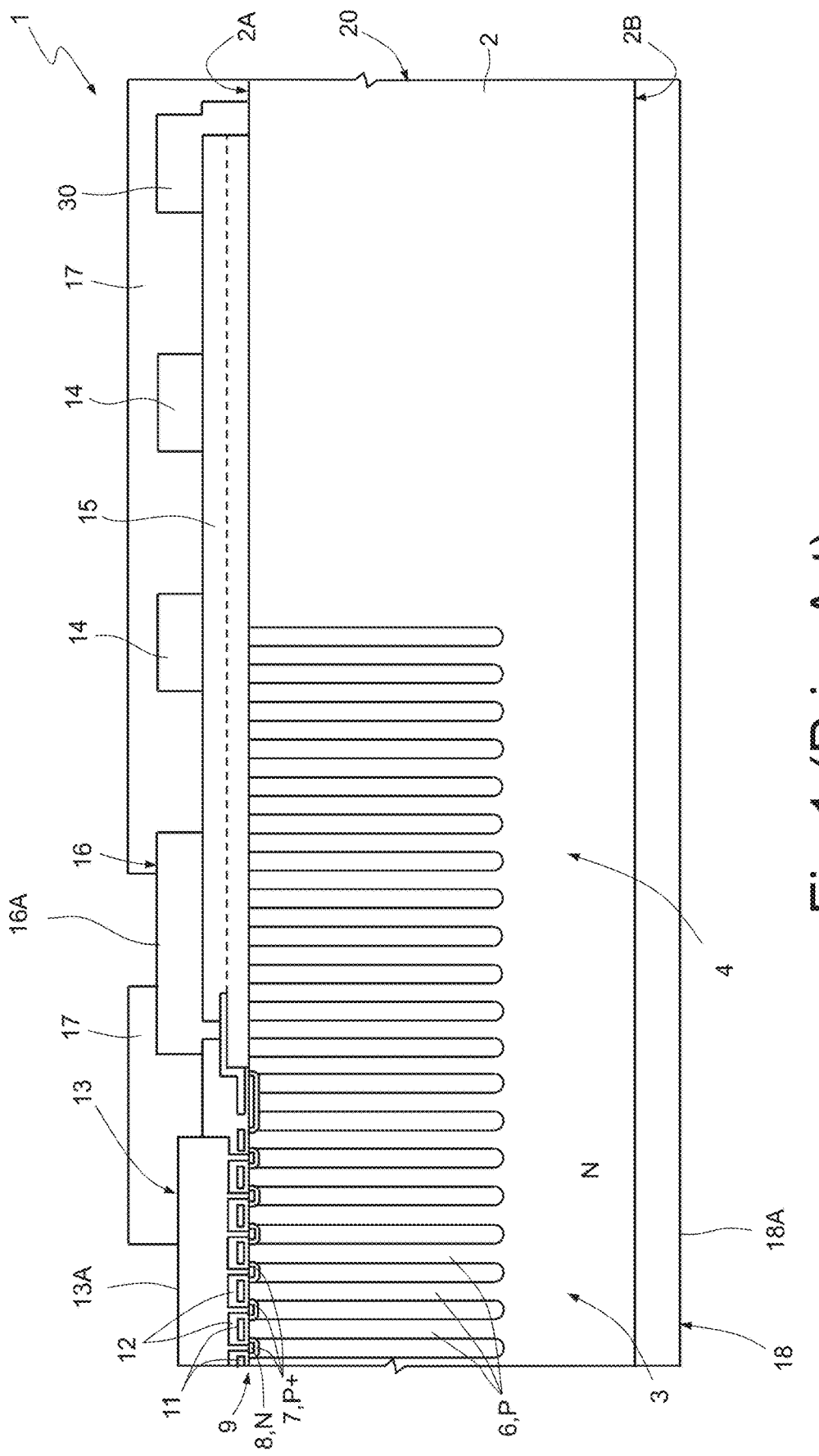
FIG. 1 is a simplified cross-section of a portion of a die integrating a power MOSFET device of a known charge-balance type.
Figure 2A:
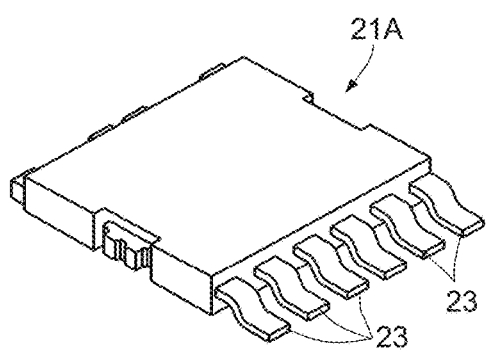
FIGS. 2A and 2B are perspective views of two packages used for integrated electronic devices.
Figure 2B:
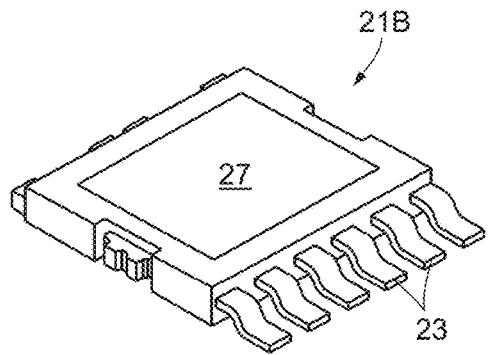
Figure 3A:
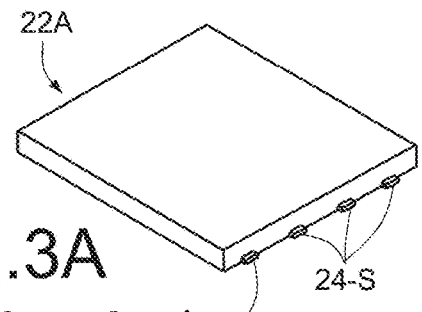
FIGS. 3A and 3B are a perspective view from above and a perspective view from below, respectively, of a package for surface mounting used for integrated electronic devices.
Figure 3C:
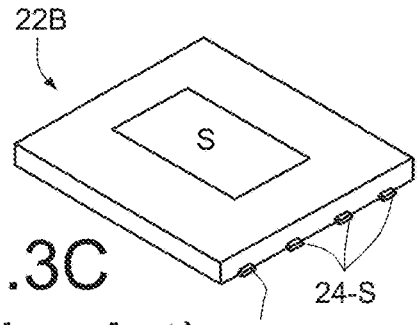
FIGS. 3C and 3D are a perspective view from above and a perspective view from below, respectively, of another package for surface mounting used for integrated electronic devices.
Figure 3B:
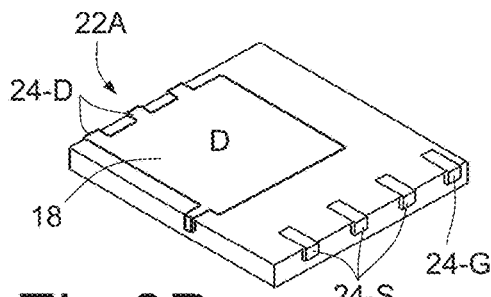
Figure 3D:
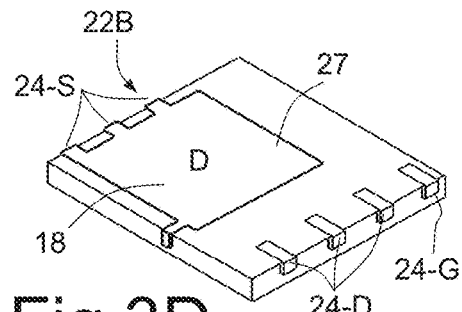

The MOSFET device 100 shown in FIG. 5 is of a charge-balance type with general structure similar to that of the MOSFET device 1 of FIG. 1. However, the present disclosure is not limited to this type of power MOSFET device, but may be applied to low-voltage (LV), high-voltage (HV), and very-high-voltage (VHV) MOSFET devices, typically operating at voltages of up to 200 V, between 200 and 800 V, and beyond 800 V, respectively, in standard, planar, superjunction, or trench technology, with fully molded package or dual side cooling (DSC) package.

The MOSFET device 100 is integrated in a die 120 comprising a body 102 of semiconductor material (typically silicon) having a first conductivity type, for example N. The body 102, of a parallelepipedal shape, has a top surface 102A and a rear surface 102B. The top surface 102A of the body 102 has a rectangular shape, comprising a long side 131 delimited by a first corner 131A and a second corner 131B of the top surface 102A (on the right and on the left, respectively, in FIG. 7A). In the considered embodiment, the body 102 is formed by a substrate and by an epitaxial layer (not shown separately in FIG. 5). The epitaxial layer is generally obtained by successive growths, and defines a central active area 103, of which a portion is shown on the left-hand side of FIG. 5, and an edge area 104, which surrounds the active area 103 and whereof FIG. 5 shows the portion arranged on the right in the active area 103.

The body 102 houses a plurality of columns 106 of a second conductivity type, here of a P type, interleaved with epitaxial layer areas of an N type. In a known manner, the columns 106 extend in parallel vertically in the body 102 and parallel to each other in a direction perpendicular to the drawing plane. Body regions 107, here of a P type, extend from the top surface 102A of the body 102 down to the top end of the columns 106 arranged in the active area 103, and accommodate source regions 108, of an N type.

Gate regions 111 extend over the top surface 102A of the body 102, between adjacent pairs of columns 106, electrically insulated from the body 102 by a gate oxide layer 109 and surrounded by an insulating region 112. A source metallization 113 extends over the active area 103 of the body 102 and over the gate regions 111 (electrically insulated from the latter by the insulating region 112), and has contact portions extending towards the top surface 102A of the body 102, through the insulating region 112, between adjacent pairs of gate regions 111, in direct electrical contact with the source regions 110, in a per se known manner. The source metallization 113 forms a source pad 113A, which occupies a large portion, in a central position, of the top surface 102A of the body 102, as visible in FIG. 7A.

A gate metallization 116, electrically connected to the gate regions 111, extends over a dielectric layer 115. As may be seen in particular in FIG. 7A, the gate metallization 116 has an annular portion 116A, a first gate pad 116B, not visible in FIG. 5, and a bridge portion 116C. In particular, the annular portion 116A of the gate metallization 116 extends approximately along the sides of a rectangle and surrounds the source metallization 113; the first gate pad 116B is arranged in proximity of the first corner 131A of the top surface 102A of the body 102, and the bridge portion 116C extends in proximity of the second corner 131B of the top surface 102A, transversely directed with respect to the sides of the rectangle formed by the top surface 102A.

In practice, the annular portion 116A has a connection stretch 116D, parallel to the side 131 of the top surface 102A, which connects together the first gate pad 116B and the bridge portion 116C.

As shown in FIG. 7A, electrically floating annular regions 114, described in greater detail hereinafter, formed starting from a same metal layer as the source metallization 113 and gate metallization 116, extend over the edge area 104, on the dielectric layer 115; the latter is here formed by a surface dielectric layer 115A and by an intermediate dielectric layer 115B, arranged on top of each other. An equipotential annular region 130, of the same material as, and formed simultaneously with, the floating annular regions 114, surrounds the latter on the outside and extends in proximity of the outer perimeter of the top surface 102A of the body 102. The equipotential annular region 130 is electrically coupled to the body 102. A top passivation layer 117 covers the top surface 102A of the body 102 and the overlying layers, except at the source pad 113A and the first gate pad 116B, as shown in FIG. 7A, where the dashed lines represent the edge of openings formed in the top passivation layer 117 and delimiting the source pad 113A and the first gate pad 116B.

As may be seen in FIG. 7A, the floating annular regions 114 have an open annular shape. In particular, they extend approximately along the sides of respective concentric rectangles, surround the source metallization 113, the annular portion 116A of the gate metallization 116, and the first gate pad 116B, but are open in proximity of the second corner 131B of the top surface 102A where the bridge portion 116C of the gate metallization 116 extends. The floating annular regions 114 are thus formed by open lines having respective ends facing each other.

As shown in FIG. 5, the bridge portion 116C is connected to a bridge region 132 of polycrystalline silicon, formed in the same layer as the gate regions 111, in electrical and physical continuity therewith. The bridge portion 116C of the gate metallization 116 and the bridge region 132 are arranged vertically on top of each other, electrically separated by an intermediate dielectric layer 115B, have a similar shape (visible in FIG. 7A for the bridge portion 116C), and form a gate connection structure 133, which extends over the top surface 102A in the area of the second corner 131B. In particular (FIG. 7A), the gate connection structure 133 extends transverse to the sides of the floating annular regions 114, between the facing ends of the floating annular regions 114, from the annular portion 116A of the gate metallization 116, and connects the gate regions 111, through the annular portion 116A, to a through via 135 formed in the edge area 104 of the body 102, in proximity of the second corner 131B of the top surface 102A.

As shown in FIG. 5, the bridge region 132 extends over the surface dielectric layer 115A and is in electrical contact with the bridge portion 16C, for example through portions of the gate metallization 116 extending through openings in the intermediate dielectric layer 115B. The bridge region 132 is thus in electrical contact with the through via 135.

The through via 135 is formed in a through opening 140, and includes a wall insulation layer 141, of a tubular shape, and filled with a conductive region 142 in direct contact with the bridge region 132. The conductive region 142 extends between the top surface 102A and the rear surface 102B of the body 102.

A drain metallization 118 extends on the rear surface 102B of the body 102 and substantially forms the drain pad 118B also visible in FIG. 7B. The drain metallization 118 is in direct electrical contact with the bottom portion of the body 102 (forming a drain region of the MOSFET device 100).

The drain metallization 118 occupies most of the rear surface 102B except for a corner thereof arranged vertically underneath the second corner 131B of the top surface 102A. In practice, FIGS. 7A and 7B show views of the MOSFET device 100 obtained by flipping over the MOSFET device 100 about a vertical line that extends in the drawing plane, between FIGS. 7A and 7B, so that the through via 135 is in the bottom left corner in FIG. 7A and in the bottom right corner in FIG. 7B.

A rear dielectric layer 138, for example, of silicon oxide, extends in the area of the rear surface 102B not occupied by the drain metallization 118 and a second gate pad 145 extends on top of the rear dielectric layer 138. The second gate pad 145 is arranged vertically under the first gate pad 116B and is in direct contact with the conductive region 142 of the through via 135 through a portion thereof extending in a contact opening 139 of the rear dielectric layer 138. In practice, the first and second gate pads 116B, 145 are in direct electrical contact with each other and with the gate regions 111.

A bottom passivation layer 119 covers the rear surface 102B of the body 102, except in the area of the drain pad 118A and of the second gate pad 145.

In this way, irrespective of the side of the die 120 fixed to a support, typically a leadframe, the first gate pad 116B or the second gate pad 145 is located in a same spatial position with respect to the support. This makes it possible to arrange the die 120 in the desired position, according to the type of application, without having to modify the layout of the die 120 or of the support, in particular as regards the position of the gate lead, as explained hereinafter in detail with reference to FIGS. 8A-11B. For instance, in this way, it is possible to attach the die 120 with the source pad 113A in contact with the leadframe, and in this case the second gate pad 145 is accessible on the opposite side of the die 120, for its external connection via a bonding wire, thus preventing problems of parasitic inductances associated to the source terminal.

Figure 6:
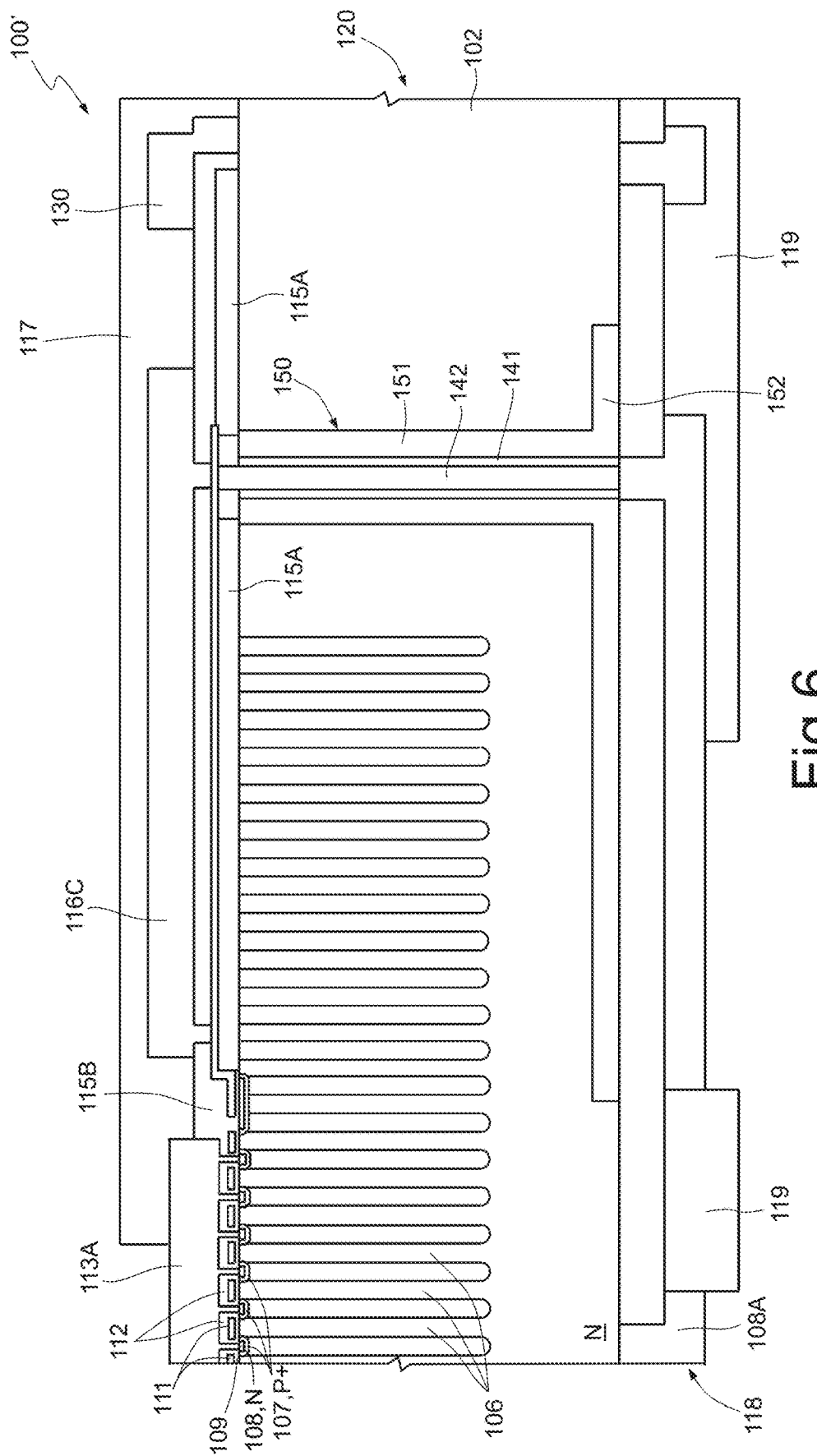
FIG. 6 is a simplified cross-section of a portion of a die integrating another embodiment of the present power MOSFET device.

FIG. 6 shows a different embodiment of the MOSFET device, here designated by 100', wherein the through via 135 has a shielding structure 150. In detail, the shielding structure 150 is a doped region of the body and comprises an annular region 151 and a surface region 152, in electrical contact with each other. The annular region 151 is a through region, extends along the wall of the through opening 140 and thus surrounds the wall-insulation layer 141 of the through via 135. The surface region 152 extends from the rear surface 102B, within the body 102, transverse to and outside the through via 135. For the rest, the MOSFET device 100' of FIG. 6 is the same as the MOSFET device 100 of FIG. 5.

Figure 4:
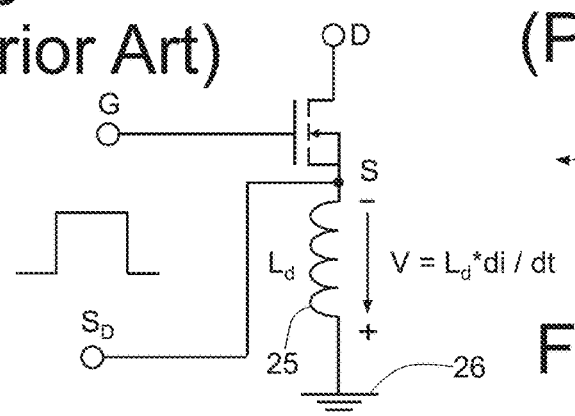
FIG. 4 shows an equivalent electrical diagram of the packages of FIGS. 2A-3D.

FIG. 7C shows a top plan view of a MOSFET device 100" having a second source pad 113B, for example for providing a second source terminal $S_D$ as discussed with reference to FIG. 4, and shown in FIGS. 11A and 11B.

The MOSFET device 100, 100', 100" thus obtained may be used in different types of package, as shown in FIGS. 8A-8D and 9A-9B, 10A-10B, and 11A-11B.

In detail, FIGS. 8A and 8B show a top view and a bottom view, respectively, of a package 170 for surface mounting of a fully molded type. Here, the package 170 exposes only the source pad 113A and leads 123-D, 123-G of a type suitable for surface mounting. A packaging mass 171 completely covers the die 120, which is thus not visible. The drain pad 118A and the second gate pad 145, also embedded in the packaging mass 171, are electrically coupled to the respective leads 123-D and 123-G via bonding wires (not visible).

FIGS. 8C and 8D show a top view and a bottom view, respectively, of a package 175 for surface mounting of a DSC type. Here, the package 175 exposes both the leadframe in direct contact with the source pad 113A and a clip 127 in direct contact with the drain pad 118A, in addition to leads 123-D and 123-G of a type suitable for surface mounting. The first gate pad 116B is embedded in the packaging mass 176 and electrically coupled to respective leads 123-G via bonding wires, not visible. The drain pad 118A is also connected to respective leads 123-D, via contacts (not visible) for connection to the clip.

FIGS. 9A and 9B show the possibility of a dual-side attach of the die 120 to a support, here a leadframe 185, in the case of a package with clip.

In particular, FIG. 9A refers to a package 180 with standard arrangement, with the drain metallization 118 (not visible) in contact with the leadframe 185. Here the clip 127 is in contact with the source pad 113A, visible only partially, and is connected to respective leads 124-S via clip connection contacts 127 (not visible). Here, the first gate pad 116B, connected to a respective lead 124-G1 via a bonding wire 188, is exposed. A further lead 124-G2 is available for direct electrical contact with the second gate pad 145 (here not visible) to enable a gate connection with different input resistance, as is at times required in certain applications to modify the on and off time constant of the MOSFET device 100, 100', in a manner known to the person skilled in the art.

With this solution, the leadframe 185 is configured not to require modifications, since it is possible to simply provide a further lead for a connection to a short-driver circuit, as discussed in detail with reference to FIG. 4.

FIG. 9B shows a package 180' wherein the same die 120 of FIG. 9A is attached to the leadframe 185 but turned over, i.e., with the source pad 113A (not visible) bonded to the leadframe 185. Here, the clip 127 is in contact with the drain pad 118A, and the latter is connected with own leads 124-D via clip connection contacts 127, in a manner not shown. With this solution, it is the second gate pad 145 that is exposed and is connected to a respective gate lead 124-G via the bonding wire 188.

FIGS. 10A and 10B show the possibility of fixing of the dual-side die 120 only by wire bonding.

In particular, FIG. 10A refers to a package 190 with a standard arrangement, with the drain pad 118A (not visible) in contact with the leadframe, which is the same of FIGS. 9A and 9B and is thus again designated by 185. Here the source pad 113A is connected to the respective leads 124-S via bonding wires 191 (in this figure, as in FIG. 11A, the annular regions 114 are not shown, and only the first gate pad 116B, the connection stretch 116D, and the bridge portion 116C of the gate metallization 116 are shown, for simplicity of representation). Further, as in FIG. 9A, the first gate pad 116B is accessible and connected to the respective lead 124-G1 via the bonding wire 188. Also here, a further lead 124-G2 is available for direct electrical contact with the second gate pad 145 (not visible) to enable a gate connection with different input resistance. Further, the leadframe 185 is configured to be easily modified to provide a further lead connecting to a driver circuit.

FIG. 10B shows a package 190' in which the same die 120 of FIG. 10A is attached to the leadframe 185 but turned upside down, i.e., with the source pad 113A (not visible) bonded to the leadframe 185. Here, the drain pad 118A is accessible and is connected to its own leads 124-D via bonding wires 192. As in FIG. 9B, with this solution, it is the second gate pad 145 that is exposed and is connected to a respective gate lead 124-G1 via the bonding wire 188.

FIGS. 11A and 11B show the possibility of attaching the dual-side die 120 only via wire bonding and with source-driver pin. In this case, the die 120', in addition to the source pad 113A, here referred to as "first source pad 113A", has a second source pad 113B formed by the same source metallization 113.

In particular, FIG. 11A refers to a package 200 with a standard arrangement, with the drain pad 118A (not visible) in contact with the leadframe 185. Here, an additional lead is present, namely, a source-driver lead 124-$S_{SD}$ connected through a bonding wire 201 to the second source pad 113B. The lead 124-$S_{SD}$ is arranged alongside the first gate lead 124-G1, so that the source leads 124-S are shifted with respect to the representation of FIGS. 9A-10B. Further, as in FIGS. 9A, 10A, the first gate pad 116B is accessible and connected to the respective lead 124-G1 via the bonding wire 188. In FIG. 11A the die 120' is represented slightly raised to show schematically—by a dashed line 202—the (direct) connection between the second gate pad 145 and the further gate lead 124-G2.

FIG. 11B shows a package 200' wherein the same die 120' of FIG. 11A is attached to the leadframe 185 but turned upside down, i.e., with the source pad 113A (not visible) bonded to the leadframe 185. Here, the drain pad 118A is accessible and is connected to its own leads 124-D via bonding wires 192. As in FIGS. 9B and 10B, the second gate pad 145 is exposed and is connected to the first gate lead 124-G1 via the bonding wire 188. Further, also FIG. 11B is represented slightly raised, to show schematically—by a dashed line 203—the (direct) connection between the first gate pad 116B and the second gate lead 124-G2 and—by a dashed line 204—the (direct) connection between the second source pad 113B and the source-driver lead 124-$S_{SD}$.

In this way, without any variation of the leadframe 185, with just a minor translation of the leads 124 mechanically attached to each other and by inserting a source-driver lead 124-$S_{SD}$ appropriately modified (FIGS. 11A and 11B) to the leadframe 185 it is possible to connect dice 202, 202' in different configurations and turned upside down to each other so as to reduce the parasitic inductances to a minimum.

FIGS. 12A-12F show an embodiment of a process for manufacturing the MOSFET device 100, 100' and 100".

Figure 12A:
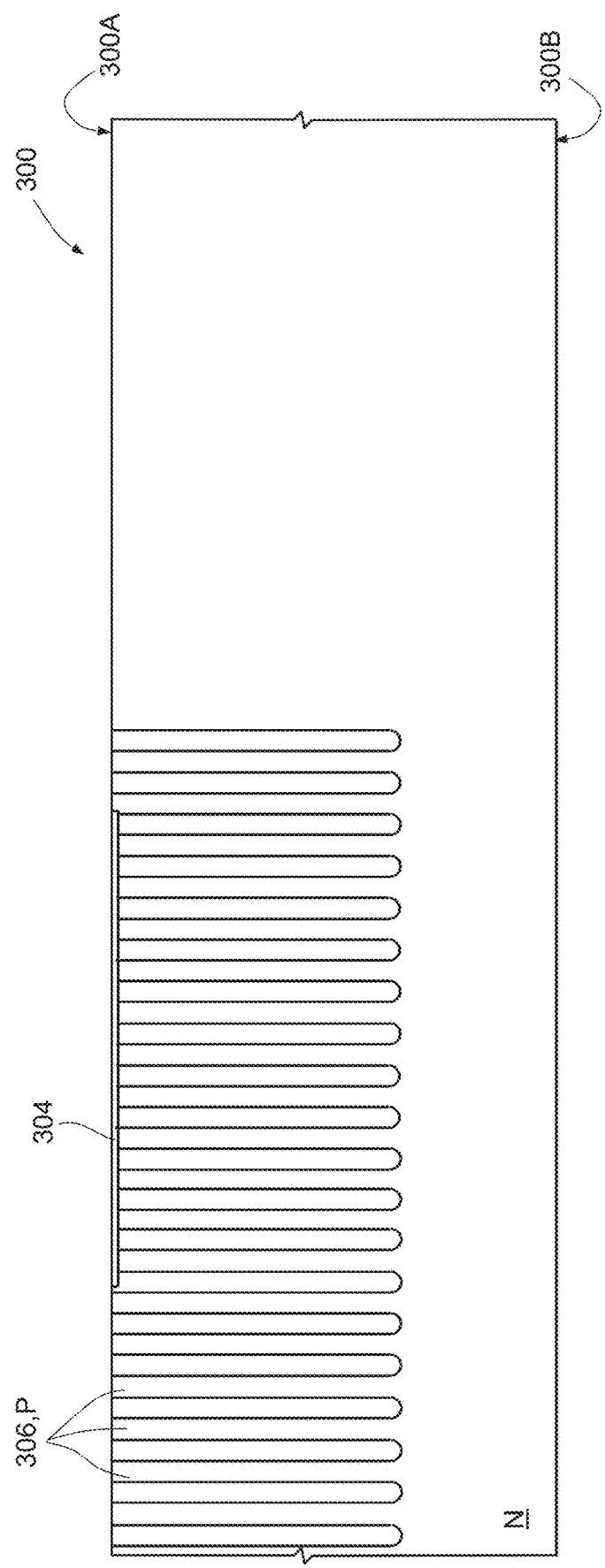
FIGS. 12A-12F are cross-sections of a portion of a die integrating the present MOSFET device, in successive manufacturing steps.
Figure 12B:
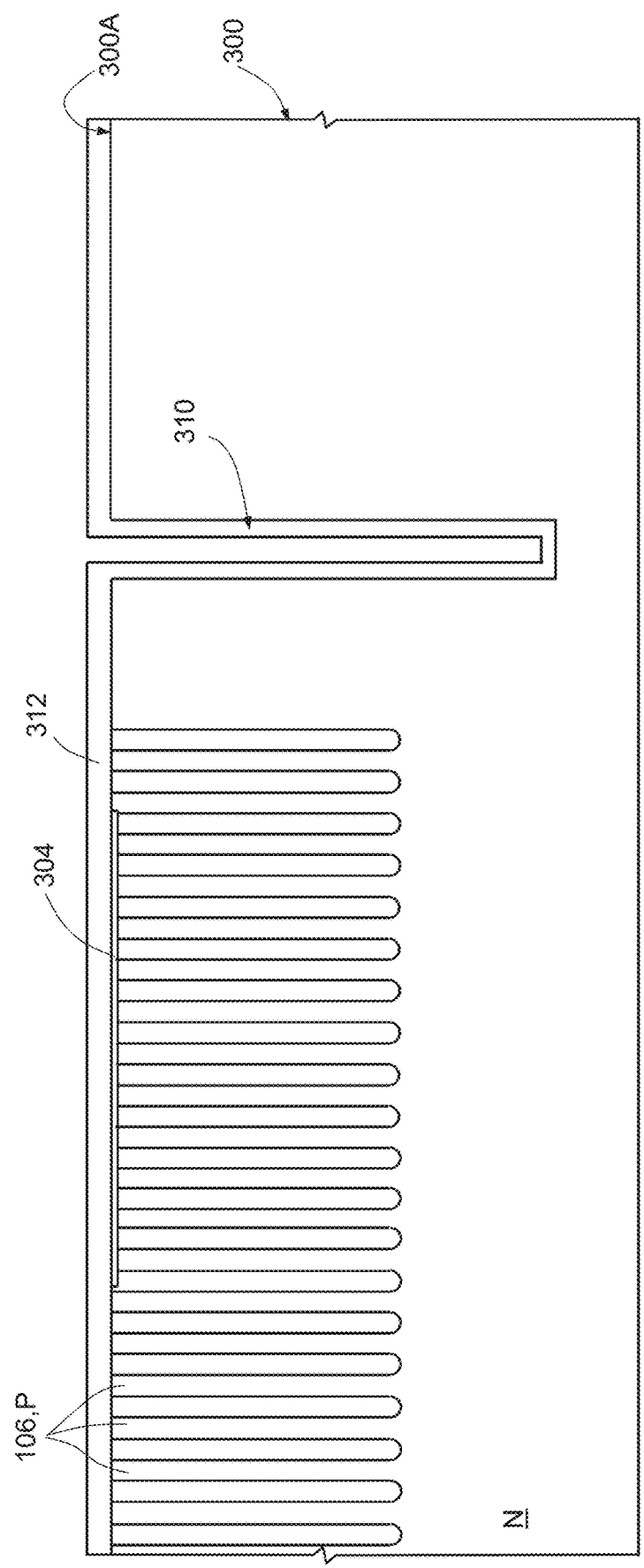
Figure 12C:
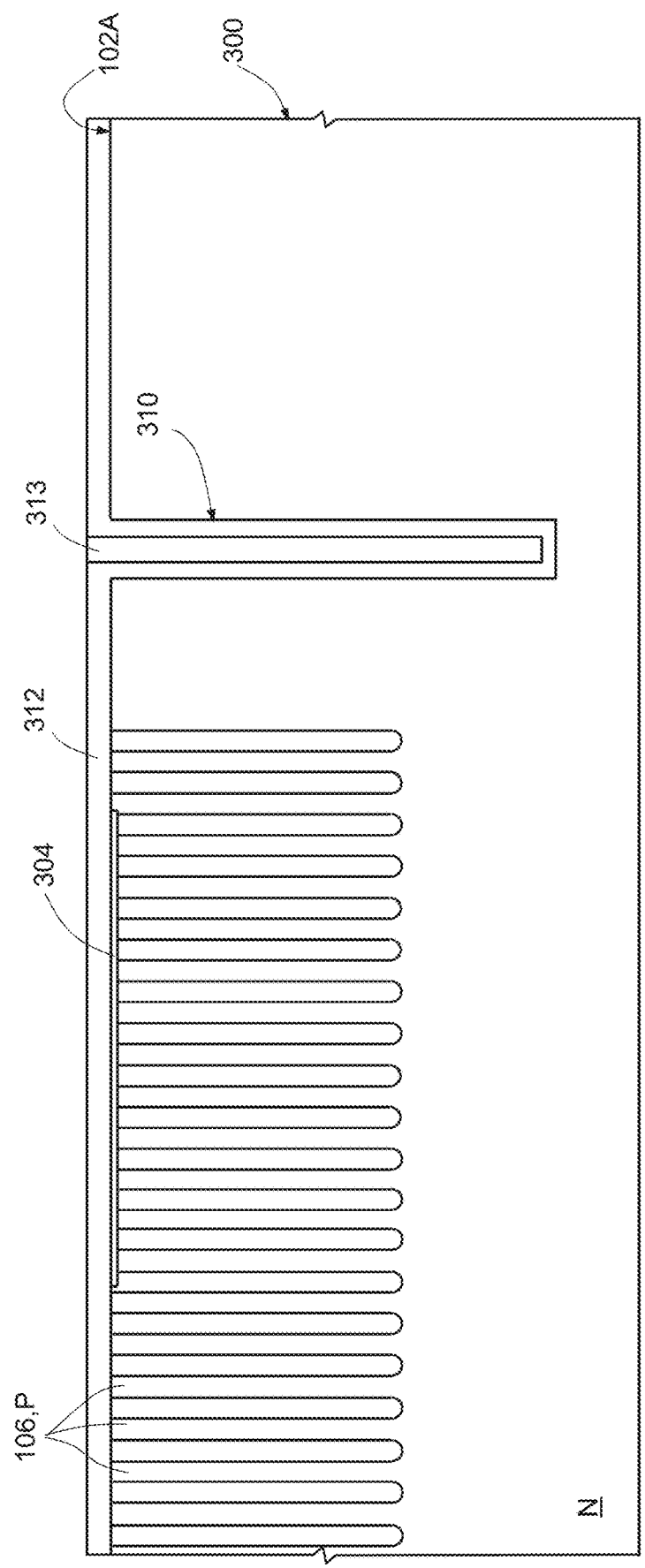
Figure 12D:
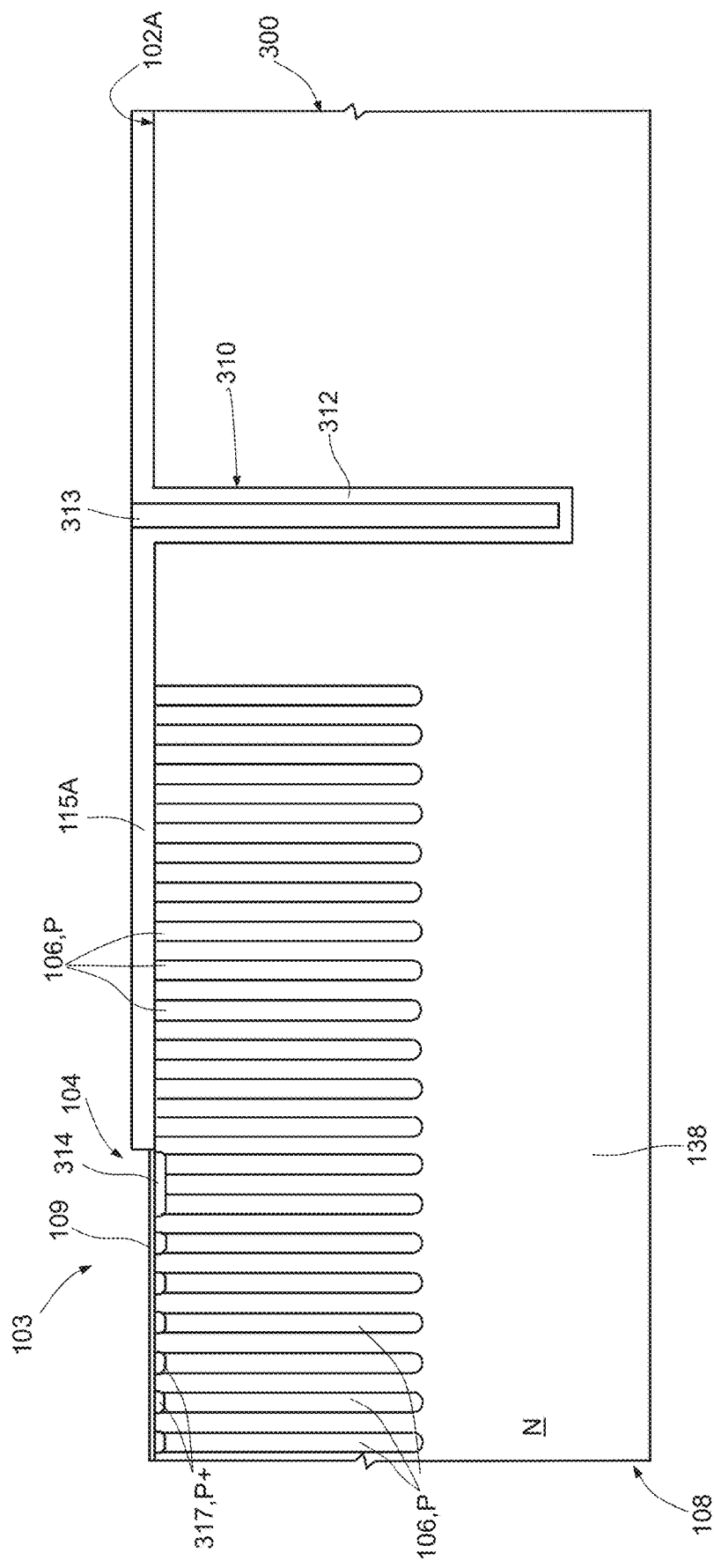
Figure 12E:
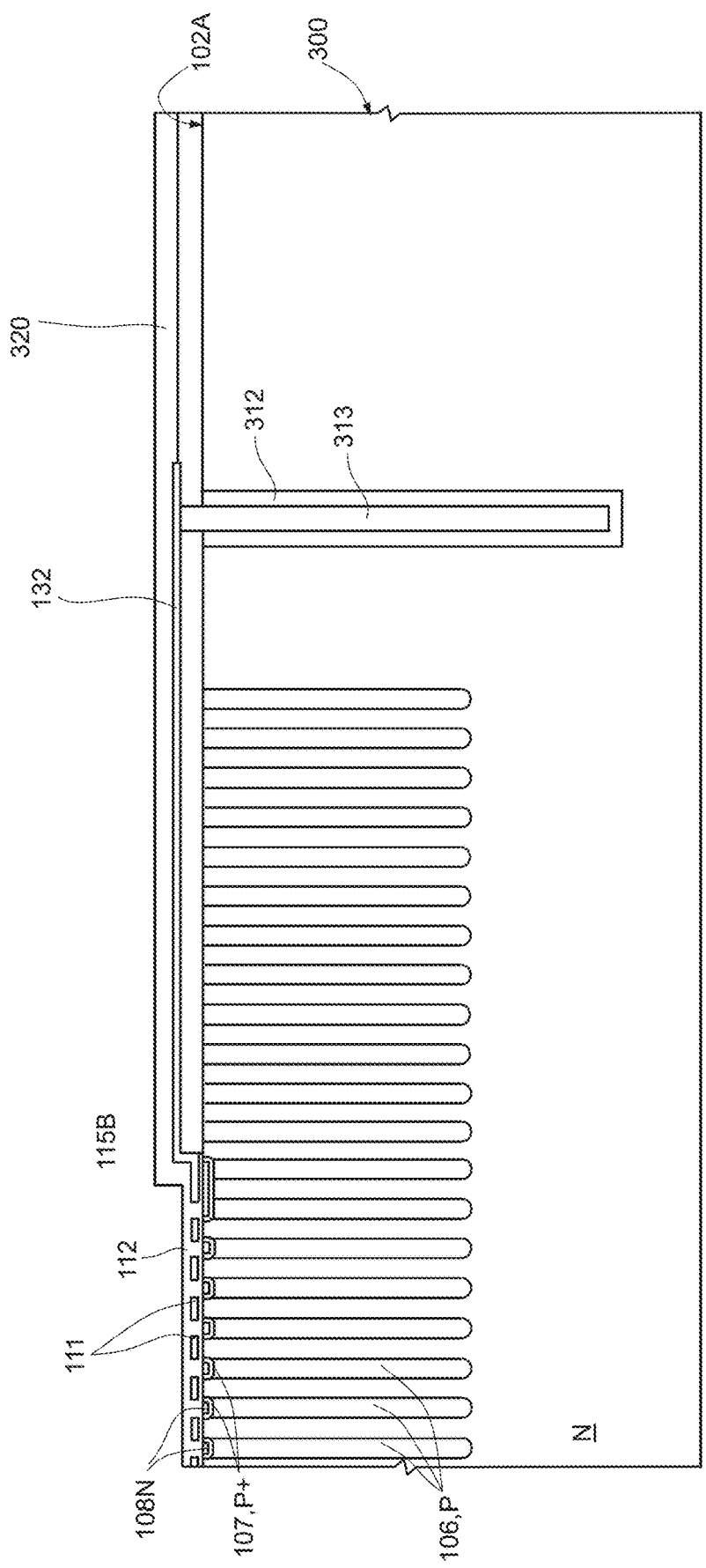
Figure 12F:
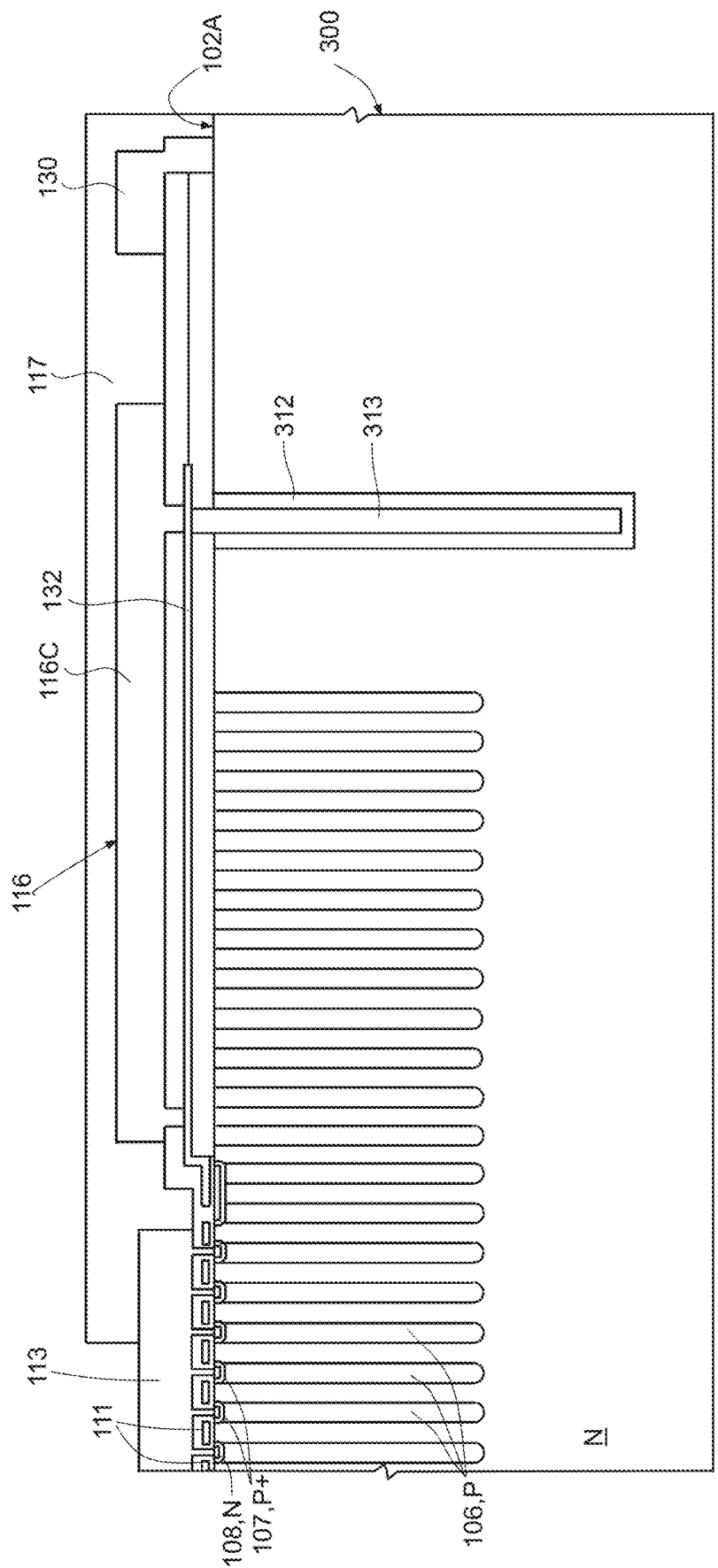

In detail, FIG. 12A shows a portion of a wafer 300 of semiconductor material intended to form the body 102. In particular, FIG. 12A shows the structure obtained after a series of steps of implanting dopant ion species of a P type (for example, boron) and subsequently, N-type epitaxial growths, starting from a substrate of an N type to form column structures 306 having a desired length, for example 40 µm, as described, for instance, in U.S. Pat. Nos. 6,586,798, 6,228,719, 6,300,171, and 6,404,010 filed in the name of the present applicant. The wafer 300 has further already been implanted in a masked way to form a field-distribution region 304, of an annular shape, in the area intended to form the edge area 104. The wafer 300 thus has a first surface 300A and a second surface 300B, and the column structures 306 extend vertically from the first surface 300A, in the direction of thickness of the wafer, as well as perpendicularly to the drawing plane and intended, after diffusion, to form the columns 106.

Next (FIG. 12B), the wafer 300 is subject to a silicon deep etching starting from the first surface 300A (corresponding to the top surface 102A of the body 102) to form a deep via 310 intended to form the through opening 140. For instance, the deep via 310 has a depth of 120 µm. A thermal-oxide layer 312 is then grown on the first surface 300A and within the deep via 310, with a thickness of approximately 1.5 µm, and is intended to form the wall insulation layer 141 within the deep via 310 and the surface dielectric layer 115A on the surface 300A of the wafer 300. Further, drain diffusion is carried out, with complete formation of the columns 106.

Next (FIG. 12C), a polycrystalline-silicon layer is deposited, which fills the deep via 310 and covers the surface of the wafer 300. The surface portion of the polycrystalline-silicon layer is removed via CMP (Chemical Mechanical Polishing) and stops on the thermal-oxide layer 312, which operates as a stopping layer. The polycrystalline-silicon layer thus remains only in the deep via 310 and forms a filling region 313, intended to subsequently form the conductive region 142.

Next (FIG. 12D), the thermal-oxide layer 312 is removed from the top surface 300A of the wafer 300 in the active area (designated by 103 by analogy with the MOSFET device 100), to form the surface dielectric layer 115A, a pre-implant oxidation is carried out, N type implant with phosphorus is performed, a first body implant of a P type is carried out to form first portions 317 of the body regions 7 in the active area 103 and a protection ring 314 in a portion of the edge area 104 immediately adjacent to the active area 103, and the gate oxide layer 109 is formed. The field-distribution region 304 diffuses and is thus no longer represented.

Then (FIG. 12E), a polysilicon layer is deposited and defined to form the gate regions 111 and the bridge region 132. In particular, as explained, the bridge region 132 extends over the edge area 104 at least as far as the filling region 313, with which it is in direct electrical contact, and thus electrically connects the gate regions 311 to the filling region 313. A second body implant of a P type is carried out to form the body regions 107 in the active area 103, the source regions 108 are implanted, and the intermediate dielectric layer 115B, for example, a BPSG (BoroPhospho-Silicate Glass) layer, is deposited and, on the active area 103, forms the insulating region 112.

Then (FIG. 12F), the intermediate dielectric layer 115B is removed selectively where the electrical-contact portions of the source and gate metallizations, as well as the bottom portion of the equipotential annular region 130, are to be formed, a first metal layer is deposited and defined, to form the source metallization 113, the gate metallization 116, the annular regions 114 (not visible in FIG. 12F) and the equipotential annular region 130, and the top passivation layer 117 is deposited and selectively removed.

The wafer 300 is then thinned out from the back side to a thickness of approximately 100 µm so as to reach the bottom of the deep via 310 and of the filling region 313, thus forming the through via 135 in the through opening 140 and defining the rear surface 102B of the body 102 (FIG. 5). The rear dielectric layer 138 is deposited and defined to form openings for drain and gate contacts. A second metal layer is deposited and defined to form the drain metallization 108 and the second gate pad 145. Finally, the bottom passivation layer 119 is deposited and defined. After dicing the wafer 300, the die 120 of FIG. 5 is obtained.

When the shielding structure 150 is provided, after silicon deep etching to form a deep via 310 (FIG. 12B) and before forming the thermal-oxide layer 312, the annular region 151 is formed by implanting P-type dopants, such as boron, in a masked way. Further, after thinning out the wafer 300, before depositing the rear dielectric layer 138, the surface region 152 is implanted in a masked way through the rear surface 102B.

The MOSFET device and the manufacturing process thereof as described herein have numerous advantages.

By virtue of the possibility of attaching the die 120 indifferently on the side of the drain metallization 108A or on the side of the source metallization 113A, the die may be arranged in the desired way to prevent parasitic inductances or in any case reduce them to a minimum, even in case of high currents, switching operation, or high switching frequency, enabling reduction in power consumption and a greater efficiency of operation. Further, the present MOSFET device considerably reduces the disturbance electromagnetic field. Consequently, it may work at higher frequencies and/or speeds and be used also for applications where EMI reduction is desired.

The present MOSFET device enables a cost reduction thanks to its positioning and packaging versatility discussed above.

Finally, it is clear that modifications and variations may be made to the MOSFET device and to the manufacturing process described and shown herein, without thereby departing from scope of the present disclosure.

For instance, the gate connection structure 133 could be formed on the rear surface 102B of the body, instead of on the first surface. In this case, the through via 135 could be formed in the first corner 131A of the top surface 102A, alongside or underneath the first gate pad 116B, and an electrical connection structure on the second surface 102B of the body 102 would connect the through via 140 to the second gate pad 145, under the second corner 131B of the first surface 102A. Further, the through via 135 may be provided in any corner of the top surface 102A. According to another variant, a plurality of through vias 135 could be provided in parallel.

For instance, the filling material of the through via could be a different conductive material, for example a metal.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MOSFET device comprising:
   a body of semiconductor material of a first conductivity type, having a first main surface and a second main surface;
   a body region, of a second conductivity type, extending within the body from the first main surface;
   a source region of the first conductivity type, extending within the body region from the first main surface;
   a conductive gate region extending on the first main surface of the body;
   a source pad extending on the first main surface and electrically coupled to the source region;
   a first gate pad extending on the first main surface, alongside the source pad, and electrically coupled to the gate region;
   a drain pad extending on the second main surface and electrically coupled to the body;
   a second gate pad extending on the second main surface, alongside the drain pad; and
   a conductive via extending through the body and electrically coupling the gate region to the second gate pad, wherein the first main surface has a generally rectangular shape having a first corner and a second corner and a first area and a second area adjacent to the first corner and to the second corner, respectively, wherein the first gate pad extends over the first area of the first main surface and the second gate pad extends in an area of the second main surface vertically aligned to the second area of the first main surface, the MOSFET device comprising a gate connection structure extending on one of the first main surface and the second main surface, and electrically coupling one of the first gate pad and the second gate pad to the conductive via.

2. The MOSFET device according to claim 1, wherein the body has an active area accommodating the body region and the source region, and an edge area accommodating the conductive via.

3. The MOSFET device according to claim 1, wherein the gate connection structure extends over the first main surface and comprises a bridge portion of metal material.

4. The MOSFET device according to claim 3, comprising a source metallization forming the source pad and a gate metallization forming the first gate pad and the bridge portion, wherein the gate metallization further comprises a connection stretch coupling together the bridge portion and the first gate pad.

5. The MOSFET device according to claim 4, further comprising a plurality of conductive field ring regions having an open annular shape, and the gate metallization further comprises an annular portion surrounding the source metallization and forming the connection stretch, the field ring regions surrounding the annular portion of the gate metallization and having respective facing ends, wherein the bridge portion extends between, and is insulated from, the facing ends of the field ring regions, and connects the annular portion of the gate metallization to the conductive via.

6. The MOSFET device according to claim 3, wherein the gate connection structure further comprises a semiconductor region extending over the first main surface and under the bridge portion, and connects the gate region to the conductive via.

7. The MOSFET device according to claim 1, comprising a packaging structure, a supporting structure, and a plurality of leads, wherein the source pad faces, and is mechanically and electrically coupled to, the supporting structure, the first gate pad faces the supporting portion and is electrically insulated from the supporting portion, the drain pad faces away from the supporting structure and is electrically coupled to at least one drain lead of the plurality of leads and the second gate pad is electrically coupled to a gate lead of the plurality of leads.

8. The MOSFET device according to claim 1, comprising a packaging structure, a supporting structure, and a plurality of leads, wherein the drain pad faces, and is mechanically and electrically coupled to, the supporting structure, the second gate pad faces the supporting structure and is electrically insulated from the supporting structure, the source pad faces away from the supporting structure and is electrically coupled to at least one source lead of the plurality of leads, and the first gate pad is electrically coupled to a gate lead of the plurality of leads.

9. A process for manufacturing a MOSFET device, comprising:
   forming, in a wafer of semiconductor material having a first main face and a second main face and a first conductivity type, a conductive via insulated from the wafer and extending completely from the first main face to the second main face;
   forming, within the wafer, a body region extending from the first main face of the wafer and having a second conductivity type;
   forming, within the body region, a source region extending from the first main face of the wafer and having the first conductivity type;
   forming, on the first main face of the wafer, a gate region;

forming, on the first main face of the wafer, a source pad extending over, and in electrical contact with, the source region;

forming, on the first main face of the wafer, a first gate pad extending over the first main face, alongside the source pad, and electrically coupled to the gate region;

forming a drain pad extending on the second main face and electrically coupled to the wafer; and forming a second gate pad extending on the main face, alongside the drain pad, and electrically coupled to the conductive via, wherein forming a source pad and forming the first gate pad comprise depositing a first metal layer on the first main face and defining the first metal layer within an area with a rectangular shape having a first corner and a second corner adjacent to each other, and a first area and a second area adjacent to the first corner and to the second corner, respectively, the first gate pad being formed on the first area of the first main face; and wherein forming the drain pad and forming the second gate pad comprise depositing a second metal layer on the second main face, and defining the second metal layer so as to form the second gate pad in an area of the second main face vertically aligned to the second area of the first main face, the process further comprising forming a gate connection structure extending on one of the first and second main faces and electrically coupling one of the first gate pad and the second gate pad to the conductive via.

10. The process according to claim 9, wherein forming the body region and forming the source region comprise introducing first dopant ion species and second dopant ion species, respectively, in an active area of the wafer.

11. The process according to claim 9, wherein defining the first metal layer comprises forming the gate connection structure, having a bridge portion of metal material electrically coupling the gate region to the conductive via.

12. The process according to claim 11, wherein defining the first metal layer further comprises:
forming a gate connection stretch electrically connecting together the bridge portion and the first gate pad; and
forming a plurality of conductive field ring regions having an open annular shape, surrounding the gate connection stretch, and having respective facing ends, wherein the bridge portion extends between, and is insulated from, the facing ends of the field ring regions, and electrically connects the gate connection stretch to the conductive via.

13. The process according to claim 11, wherein forming the gate connection structure further comprises, before depositing the first metal layer, forming a semiconductor region extending over the first main face of the wafer between the gate region and the conductive via.

14. The process according to claim 9, comprising:
dicing the wafer to form a die;
mechanically and electrically coupling the source pad to a supporting structure;
electrically coupling the drain pad 108A to at least one drain lead via wire bonding and/or clip bonding; and
electrically coupling the second gate pad to a gate lead via wire bonding.

15. The process according to claim 9, comprising:
dicing the wafer to form a die;
mechanically and electrically coupling the drain pad to a supporting structure);
electrically coupling the source pad to at least one source lead via wire bonding and/or clip bonding; and
electrically coupling the first gate pad to a gate lead via wire bonding.

16. The process according to claim 9, wherein forming the conductive via includes:
forming the conductive via extending partway through the wafer; and
thinning out the wafer from the second main face as far as the conductive via.

17. A MOSFET device comprising:
a body of semiconductor material of a first conductivity type, having a first main surface and a second main surface;
a source region, of the first conductivity type, extending within the body;
a conductive gate region;
a first gate pad extending on the first main surface and electrically coupled to the gate region;
a second gate pad extending on the second main surface; and
a conductive via extending through the body and electrically coupling the first gate pad to the second gate pad, wherein the first main surface has a generally rectangular shape having a first corner area and a second corner area spaced apart from each other, wherein the first gate pad extends over the first corner area of the first main surface and the second gate pad extends in an area of the second main surface vertically aligned to the second corner area of the first main surface.

18. The MOSFET device according to claim 17, comprising a gate connection structure extending on one of the first main surface and the second main surface, and electrically coupling one of the first gate pad and the second gate pad to the conductive via.

* * * * *